United States Patent [19]

Lins

[11] 4,095,279
[45] June 13, 1978

[54] ORTHOGONAL POTENTIAL WELL MATRIX AND AMPLITUDE MODULATED BIAS FIELD FOR BUBBLE DOMAIN PROPAGATION

[75] Inventor: Stanley James Lins, Bloomington, Minn.

[73] Assignee: Sperry Rand Corporation, New York, N.Y.

[21] Appl. No.: 785,807

[22] Filed: Apr. 8, 1977

[51] Int. Cl.² ........................................... G11C 19/08
[52] U.S. Cl. ........................................ 365/29; 365/30; 365/32; 365/36; 365/37
[58] Field of Search ............................... 340/174 TF

[56] References Cited

U.S. PATENT DOCUMENTS

| | | | |
|---|---|---|---|
| 3,887,905 | 6/1975 | Bobeck et al. | 340/174 TF |
| 3,916,395 | 10/1975 | Urai | 340/174 TF |
| 3,944,842 | 3/1976 | Dorleijn et al. | 340/174 TF |
| 3,996,571 | 12/1976 | Chang | 340/174 TF |

*Primary Examiner*—James W. Moffitt

*Attorney, Agent, or Firm*—Kenneth T. Grace; William E. Cleaver; Marshall M. Truex

[57] ABSTRACT

An apparatus for and a method of propagating bubble domains is disclosed. The apparatus includes a memory plane that is comprised of a non-magnetic support member upon which are formed a bubble domain layer and at least one stripe domain layer. The stripe domain layer has a set of relatively-narrow, periodic, potential well generating fixed stripe domains provided therein while the bubble domain layer has a set of relatively-wide, parallel, potential well generating fixed guidance channels provided therein that are oriented orthogonal to the parallel set of stripe domains in the stripe domain layer. Bubble domains are concurrently entered, in parallel, at one end of the memory plane in selected ones of the guidance channels. A periodic amplitude modulated bias field of frequency F propagates each of the bubble domains along the associated guidance channel from adjacent to next downstream adjacent stripe domain and thus through the memory plane at the frequency F.

4 Claims, 5 Drawing Figures

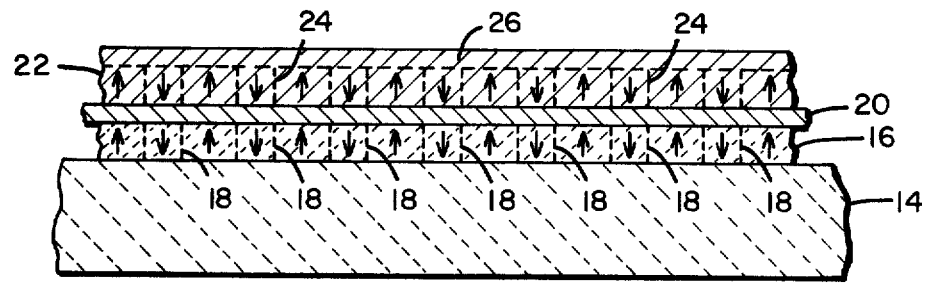
_Fig. 2a_
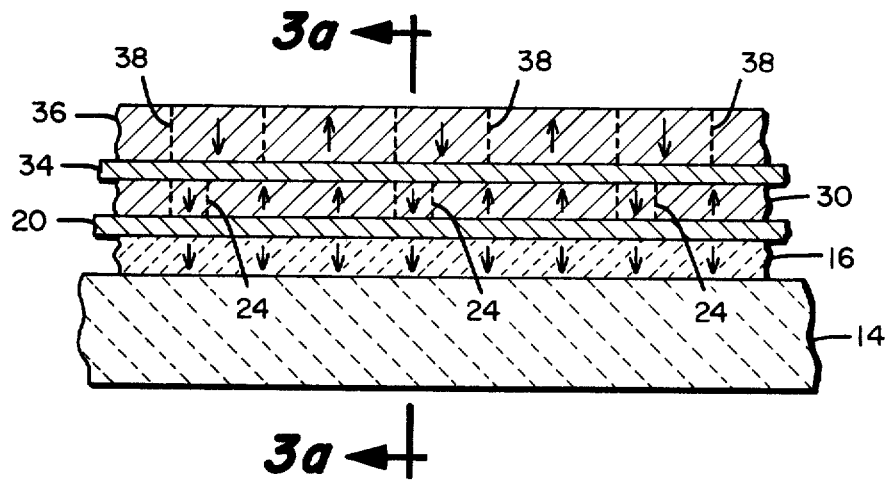
_Fig. 3_
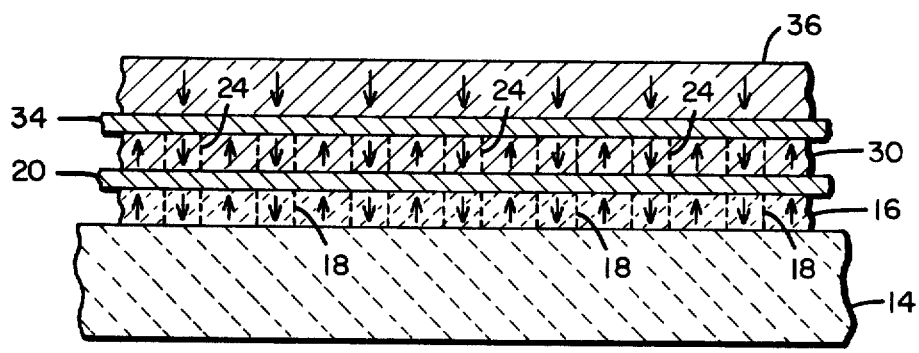
_Fig. 3a_

4,095,279

ORTHOGONAL POTENTIAL WELL MATRIX AND AMPLITUDE MODULATED BIAS FIELD FOR BUBBLE DOMAIN PROPAGATION

BACKGROUND OF THE INVENTION

In my copending patent application filed Aug. 2, 1976, Ser. No. 710,773, there is disclosed a bubble memory plane that utilizes stripe domains in a multi-layer garnet medium to structure and propagate bubble domains. The concept of that invention utilizes a garnet structure that utilizes a first stripe domain layer and a second bubble domain layer sandwiching a garnet (GGG) spacer therebetween. The stripe domains in a stripe domain layer form a periodic variation of potential energy well-depth which will capture the bubbles in the bubble domain layer and space the bubble domains uniformly in accordance with the spacing of the stripe domains in the stripe domain layer. The array of stripe domains is then made to move uniformly, propagating the captured bubble domains in the bubble domain layer. The bubble domains in the bubble domain layer can be guided in the direction of stripe domain motion by means of guidance channels that are associated with the bubble domain layer and that are oriented perpendicular to the length of the stripe domains in the stripe domain layer. The stripe domains in the stripe domain layer are sustained by the natural characteristics of the stripe domain layer, and, thus are self-structuring.

In the publication "Gradientless Propulsion and State Switching of Bubble Domains", B. E. Argyle, et al, IBM Research Report RC6024 (No. 26083) June 2, 1976, there is taught the concept of moving bubble domains in bubble lattice files (BLF) using the method of automation. The bubble domains are structured at the bubble domain forming lattice intersections and the lattice file is translated by a time modulated bias field $H_B$ that is directed normal to the plane of the bubble lattice file supporting garnet film, which bias field has a sinusoidal intensity (amplitude) modulation of a frequency F and by a constant amplitude in plane field $H_p$. The modulated bias fields in conjunction with the in-plane field, causes the entire lattice file to translate in a predetermined direction. Additionally, in the publication "Effects Of Abrupt Changes In Film Thickness On Magnetic Bubble Forces", T. W. Collins, et al, IBM J. Res. Develop., Volume 20, No. 2, March 1976, pp. 132 – 137, there is taught the effect that the variation in thickness of a bubble domain layer provides an increased field gradient on a bubble domain in the area of the thickness gradient requiring increased drive fields to move the bubble domain across the thickness gradient in the bubble layer.

SUMMARY OF THE INVENTION

The present invention is considered to be an improvement invention to that of the above-discussed prior art. In the present invention, the memory plane is formed of an integral, laminated structure, preferably formed by the well-known liquid phase epitaxy (LPE) method in which are provided a set of parallel, potential well generating fixed stripe domains and an orthogonal set of parallel fixed guidance channels, the intersections of which define and structure bubble domain positions in a magnetically coupled bubble domain layer. The bubble domains are entered, in parallel, in selected ones of the guidance channels and are propagated along the associated one of the guidance channels, from intersection to the next downstream intersection of the stripe domains, by an amplitude modulated bias field that is directed normal to the plane of the memory plane and a constant amplitude in-plane field. Each cycle of the bias field amplitude modulation propagates all of the bubble domains, in parallel, each along the associated guidance channel from upstream intersection to next adjacent downstream intersection at the frequency of the bias field amplitude modulations.

BRIEF DESCRIPTION OF THE DRAWINGS

FIG. 2a is a cross-sectional view of the memory plane of FIG. 2 taken along line 2a—2a thereof.

FIG. 3 is a cross-sectional view of the memory plane of FIG. 1 taken along line 3—3 thereof illustrating a second embodiment of the memory plane of FIG. 1.

FIG. 3a is a cross-sectional view of the memory plane of FIG. 3 taken along line 3a—3a thereof.

DESCRIPTION OF THE PREFERRED EMBODIMENT

Figure 1:
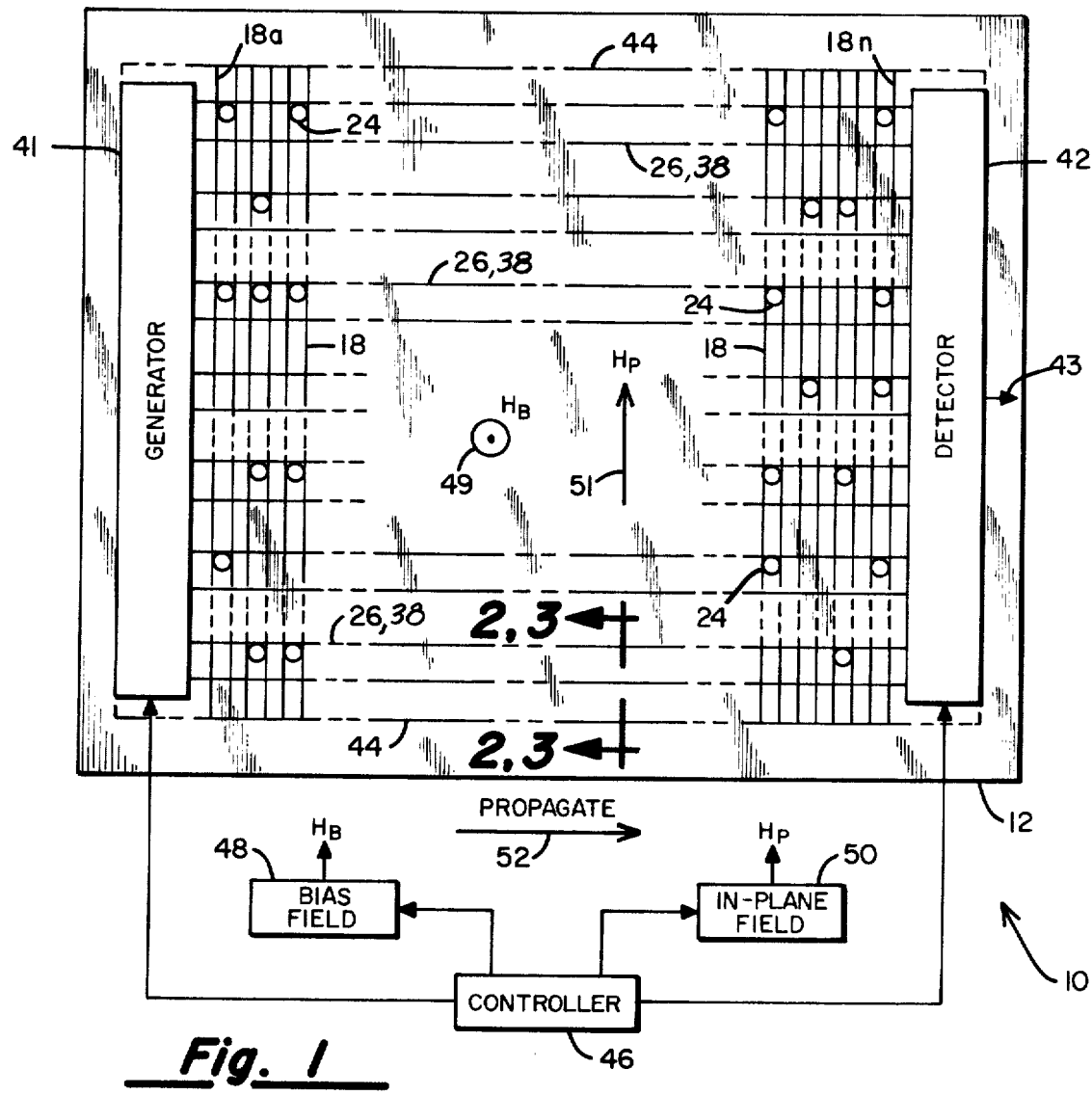
FIG. 1 is a block diagram of a bubble domain memory system incorporating the present invention.
Figure 2:
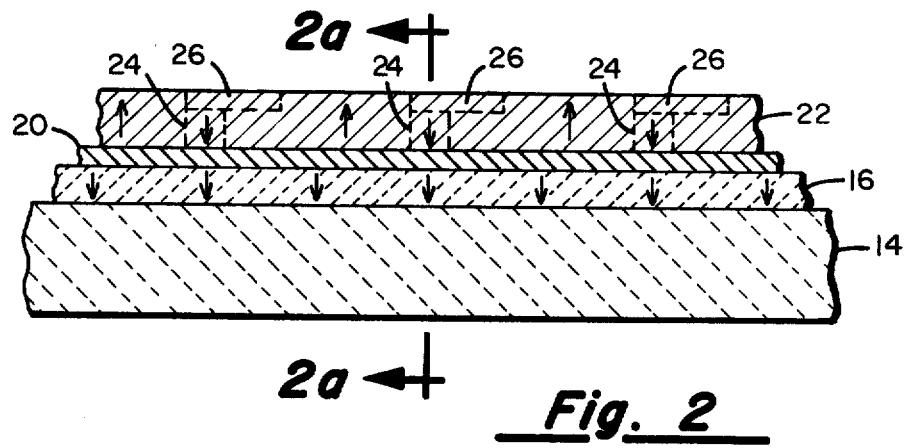
FIG. 2 is a cross-sectional view of the memory plane of FIG. 1 taken along line 2—2 thereof illustrating a first embodiment of the memory plane of FIG. 1.

With particular reference to FIG. 1 there is presented a block diagram of a system 10 incorporating the present invention. System 10 includes a memory plane 12, which is a laminated, integral structure the layers of which are preferably formed by the liquid phase epitaxy (LPE) method. With particular reference to FIG. 2 and FIG. 3 there are presented illustrations of cross sections of first and second embodiments of the memory plane 12 of FIG. 1 taken along line 2,3—2,3 thereof.

FIG. 2 illustrates a first embodiment of the memory plane 12 of FIG. 1 in that memory plane 12 is comprised of a plurality of stacked, superposed layers preferably integrally formed by the liquid phase epitaxial (LPE) method and is comprised of a non-magnetic garnet support layer 14 of Gadolinium Gallium Garnet (GGG) of approximately 800 microns ($\mu$m) in thickness upon which are formed the following successive layers. Upon support layer 14 there is generated a stripe domain layer 16 of a magnetizable material of 3 – 10 $\mu$m in thickness in which is formed a set of relatively narrow fixed stripe domains 18. See the publication "Variation of Stripe-Domain Spacing In A Faraday Effect Light Deflector," T. R. Johansen, et al, JAP, Vol. 42, No. 4, Mar. 15, 1971, p. 1715. Next, upon stripe domain layer 16 there is generated a non-magnetic garnet spacer layer 20 of GGG of 0.5 – 10 $\mu$m in thickness. Next, upon spacer layer 20 there is generated a bubble domain layer 22 of a magnetizable material of 3 – 10 $\mu$ms in thickness in which a plurality of bubble domains 24 may be generated, sustained and moved about. Bubble domains 24 are, in the horizontal direction of FIG. 1, established in a fixed spatial positioning by a plurality of relatively-wide fixed guidance channels 26 which are generated by ion-milling or ion-implantation. With particular reference to FIG. 2a there is illustrated a cross section of memory plane 12 of FIG. 2 taken along line 2a—2a thereof for the purpose of illustrating the orientation of the relatively-narrow periodic potential well forming fixed stripe domains 18 with respect to the positioning of the bubble domains 24 along one of the relatively-wide fixed guidance channels 26 in bubble domain layer 22. The relatively-wide fixed guidance channels 26 in bubble domain layer 22 serve as fixed guidance channels for bubble domain 24 propagation; the relatively-narrow fixed stripe domains 18 in stripe domain layer 16 serve to establish periodic potential wells along the lengths of the relatively-wide fixed guidance channels 26 in bubble domain layer 22.

With particular reference to FIG. 3 there is presented an illustration of a cross section of a second embodiment of the memory plane 12 of FIG. 1 taken along line 3—3 thereof. FIG. 3 illustrates that memory plane 12 is comprised of a plurality of stacked, superposed layers preferably integrally formed by the liquid phase epitaxial method (LPE) and is comprised of a non-magnetic garnet support layer 14 of Godolinium Gallium Garnet (GGG) of approximately 800 μm in thickness upon which are formed the following successive layers. Upon support layer 14 there is generated a stripe domain layer 16 of a magnetizable material of 3 – 10 μms in thickness in which is formed a set of relatively-narrow fixed stripe domains 18. Next upon stripe domain layer 16 there is generated a non-magnetic garnet spacer layer 20 of GGG of 0.5 – μms in thickness. Next, upon spacer layer 20 there is generated a bubble domain layer 30 of a magnetizable material of 3 – 10 μms in thickness in which a plurality of bubble domains 24 may be generated, sustained and moved about. Next, upon bubble domain layer 30 there is generated a non-magnetic garnet spacer layer 34 of GGG of 0.5 – 10 μms in thickness. Next, upon spacer layer 34 there is generated a stripe domain layer 36 of a magnetizable material of 3 – 10 μms in thickness in which a plurality of stripe domains 38 are established in a fixed spatial positioning orthogonal to the relatively-narrow fixed stripe domains 18 in stripe domain layer 16. The relatively-wide fixed stripe domains 38 in stripe domain layer 36 serve as fixed guidance channels for bubble domain 24 propagation; the relatively-narrow fixed stripe domains 18 in stripe domain layer 16 serve to establish periodic potential wells along the lengths of the relatively-wide fixed stripe domains 38 in stripe domain layer 36. With particular reference to FIG. 3a there is presented an illustration of a cross section of the memory plane 12 of FIG. 3 taken along line 3a—3a thereof. FIG. 3 illustrates the vertical and horizontal orientation of the bubble domains 24 in bubble domain layer 30 aligned along the relatively-wide fixed guidance channels 38 in stripe domain layer 36 and spaced therealong by the relatively-narrow periodic potential well forming fixed stripe domains 18 in stripe domain layer 16.

In both embodiments of memory plane 12 of FIG. 2 and FIG. 3 the last step in the generation of memory plane 12 is the generation by many well-known vapor deposition techniques, of generator 41 and detector 42. Also, memory plane 12 preferably has a barrier 44 established therein for defining the active area of memory plane 12.

Using the embodiment of memory plane 12 as illustrated in FIGS. 2 and 2a, generator 41, under control of controller 46, selectively generates a plurality of bubble domains 24 that are inserted into, e.g., bubble domain layer 22 at selected ones of the relatively-wide fixed guidance channels 26, upstream, left-most relatively-narrow periodic potential well forming fixed stripe domain 18a intersections. Also provided are a bias field source 48 for providing the amplitude modulated bias field $H_B$, indicated in the active area of memory plane 12 by the dot and concentric circle 49 indicative of a field that is directed normal to the plane of memory plane 12, and an in-plane field source 50 for coupling the steady state in-plane field $H_p$, indicated by the vector 51 located within the active area of memory plane 12. At the downstream or right-most end of memory plane 12, detector 42, under control of controller 46, detects and provides on line 43 a suitable output signal that is indicative of the existence vel non of the bubbles 24 that are coupled thereto by the right-most relatively-narrow periodic potential well forming fixed stripe domain 18n, which bubbles 24 are propagated in the downstream direction, from left to right, as denoted by propagate vector 52.

A brief description of the operation of system 10 of FIG. 1 is as follows. With controller 46 energizing bias field source 48 and in-plane field source 50, generator 41 selectively generates a plurality of bubble domains 24 which are coupled to the lefthand or upstream end of the parallel set of horizontally oriented relatively-wide fixed guidance channels 26. Under the influence of the in-plane field $H_p$ oriented in a direction denoted by vector 51 and the time dependent, spatially homogeneous, amplitude modulated bias field $H_B$ which is directed normal to the plane of memory plane 12, as denoted by the dot and concentric circle 49, the bubble 24 in each of the relatively-narrow fixed stripe domains 26, upon each modulation cycle of the bias field $H_B$, propagates from a upstream relatively-narrow fixed stripe domain 18 to the next adjacent downstream relatively-narrow fixed stripe domain 18 along the associated relatively-wide fixed guidance channel 26. This amplitude modulated bias field $H_B$ operation is similar to that of the concept of bubble domain propagation by automotion as taught by the hereinabove discussed B. E. Argyle, et al, publication. Accordingly, for each complete modulation cycle of the bias field $H_B$, all the bubbles 24 in bubble domain layer 22 of memory plane 12 are moved downstream from and into the next adjacent relatively-narrow fixed stripe domain 18, progressing from the upstream or left-most relatively-narrow fixed stripe domain 18a to the downstream right-most relatively-narrow fixed stripe domain 18n and thence to be detected by detector 42.

Accordingly, it can be seen that the present invention provides a novel means of structuring the positions of a plurality of bubble domains within a memory plane while concurrently propagating such bubble domains through the memory plane in a predetermined and predictable manner. By utilizing the intersections of a parallel set of fixed guidance channels and an orthogonally oriented parallel set of periodic potential well forming fixed stripe domains in conjunction with a steady state in-plane field $H_P$ and an amplitude modulated bias field $H_B$ that causes the bubble domains to move from an upstream to a downstream next adjacent relatively-narrow periodic potential well forming fixed stripe domain along an associated relatively-wide fixed guidance channel, the natural structure of the magnetic characteristics of the stripe domain and bubble domain layers are utilized thereby permitting the elimination of complex overlays of, e.g., copper drive lines and Permalloy propagation patterns.

What is claimed is:

1. A bubble domain propagation apparatus, comprising:
   a first layer of a magnetizable material in which are formed a plurality of parallel, spaced-apart first periodic potential wells;

a second layer of a magnetizable material in which are formed a plurality of parallel, spaced-apart second periodic potential wells which are orthogonally oriented with respect to said plurality of parallel, spaced-apart first periodic potential wells in said first layer for forming a plurality of first periodic potential well, second periodic potential well intersections;

bubble generator means coupled to said second periodic potential wells for selectively coupling bubble domains into selected ones of said intersections along a first one of said first periodic potential wells;

in-plane field generator means for coupling an in-plane field $H_P$ in the plane of said second layer; and, bias field generator means for coupling an amplitude modulated bias field $H_B$ normal to the planes of said first and second layers, said bias field $H_B$ having an amplitude modulated frequency F for propagating the bubble domains along the associated second periodic potential well from upstream to next adjacent downstream intersection at said frequency F at successive cycles of said amplitude modulated bias field $H_B$.

2. A bubble domain propagation apparatus, comprising:

a stripe domain layer of a magnetizable material in which are formed a plurality of parallel, spaced-apart periodic potential well forming fixed stripe domains;

a bubble domain layer of a magnetizable material in which are formed a plurality of parallel, spaced-apart fixed guidance channels and which are orthogonally oriented with respect to said plurality of parallel, spaced-apart fixed stripe domains in said stripe domain layer for forming a plurality of fixed guidance channel, fixed stripe domain intersections;

bubble generator means coupled to said plurality of parallel, spaced-apart fixed guidance channels for selectively coupling bubble domains into selected ones of said intersections along a first one of said fixed stripe domains;

in-plane field generator means for coupling an in-plane field $H_p$ in the plane of said bubble domain layer; and, bias field generator means for coupling an amplitude modulated bias field $H_B$ normal to the plane of said bubble domain layer, said bias field $H_B$ having an amplitude modulation frequency F for propagating the bubble domains along the associated fixed guidance channels from upstream to next adjacent downstream intersections at successive cycles of said amplitude modulated bias field $H_B$.

3. A bubble domain propagation apparatus, comprising:

a non-magnetic substrate;

a stripe domain layer of a magnetizable material in which are formed a plurality of parallel, spaced-apart relatively-narrow periodic potential well forming fixed stripe domains;

a non-magnetic spacer layer;

a bubble domain layer of a magnetizable material in which are formed a plurality of parallel, spaced-apart relatively-wide fixed guidance channels and which are orthogonally oriented with respect to said plurality of parallel, spaced-apart relatively-narrow fixed stripe domains in said stripe domain layer for forming a plurality of relatively-wide fixed guidance channel, relatively-narrow fixed stripe domain intersections;

bubble generator means coupled to said plurality of parallel, spaced-apart relatively-wide fixed guidance channels for selectively coupling bubble domains into selected ones of said intersections along a first one of said relatively-narrow fixed stripe domains;

in-plane field generator means for coupling a constant amplitude in-plane field $H_p$ in the plane of said bubble domain layer and parallel to said relatively-narrow fixed stripe domains; and, bias field generator means for coupling an amplitude modulated bias field $H_B$ normal to the plane of said bubble domain layer, said bias field $H_B$ having an amplitude modulation frequency F for propagating the bubble domains along the associated relatively-wide fixed guidance channels from upstream to next adjacent downstream intersection at said amplitude modulation frequency F.

4. A bubble domain propagation apparatus, comprising:

a non-magnetic substrate;

a first stripe domain layer of a magnetizable material in which are formed a plurality of parallel, spaced-apart relatively-narrow periodic potential well forming fixed stripe domains;

a first non-magnetic spacer layer;

a bubble domain layer of a magnetizable material in which a plurality of bubble domains are capable of being generated, sustained and moved about;

a second non-magnetic spacer layer;

a second stripe domain layer of a magnetizable material in which are formed a plurality of parallel, spaced-apart relatively-wide periodic potential well forming fixed stripe domains and which are orthogonally oriented with respect to said plurality of parallel, spaced-apart relatively-narrow fixed stripe domains in said first stripe domain layer for forming a plurality of relatively-wide fixed stripe domain relatively-narrow fixed stripe domain intersections;

bubble generator means coupled to said plurality of parallel, spaced-apart relatively-wide fixed stripe domains for selectively coupling bubble domains into selected ones of said intersections along a first one of said relatively-narrow fixed stripe domains;

in-plane field generator means for coupling an in-plane field $H_p$ in the plane of said bubble domain layer; and, bias field generator means for coupling a time dependent, spatially homogenous, amplitude modulated bias field $H_B$ normal to the plane of said bubble domain layer, said bias field $H_B$ having an amplitude modulation frequency F for propagating the bubble domains along the associated relatively-wide fixed stripe domains from upstream to next adjacent downstream intersection at said amplitude modulation frequency F.

* * * * *